(12) United States Patent
Kim et al.

(10) Patent No.: US 8,773,859 B2
(45) Date of Patent: Jul. 8, 2014

(54) DRIVER PACKAGE

(75) Inventors: JinHyong Kim, Goyang-si (KR);
SeungTae Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 232 days.

(21) Appl. No.: 13/433,178

(22) Filed: Mar. 28, 2012

(65) Prior Publication Data

US 2013/0083487 A1 Apr. 4, 2013

(30) Foreign Application Priority Data

Oct. 4, 2011 (KR) .................. 10-2011-0100909

(51) Int. Cl.
*H05K 7/20* (2006.01)
(52) U.S. Cl.
USPC ........... 361/713; 361/704; 361/719; 361/720; 257/712; 257/713; 165/80.3
(58) Field of Classification Search
None
See application file for complete search history.

(56) References Cited

U.S. PATENT DOCUMENTS

| | | | |
|---|---|---|---|
| 6,522,543 B2 * | 2/2003 | Kurihara et al. | 361/704 |
| 7,133,705 B2 * | 11/2006 | Akatsuka et al. | 455/575.1 |
| 7,388,748 B2 * | 6/2008 | Shin | 361/704 |
| 7,391,616 B2 * | 6/2008 | Kim et al. | 361/719 |
| 7,903,422 B2 * | 3/2011 | Watanabe | 361/719 |
| 7,969,741 B2 * | 6/2011 | Hayakawa et al. | 361/708 |
| 8,183,088 B2 * | 5/2012 | Jeon et al. | 438/106 |
| 8,467,187 B2 * | 6/2013 | Itazawa et al. | 361/690 |

FOREIGN PATENT DOCUMENTS

| | | |
|---|---|---|
| CN | 1744305 A | 3/2006 |
| CN | 1992247 A | 7/2007 |
| JP | 2000-340610 A | 12/2000 |
| KR | 10-2000-0030091 A | 6/2000 |

OTHER PUBLICATIONS

State Intellectual Property Office of the People's Republic of China, Office Action and Search Report, Chinese Patent Application No. 201210347941.3, Apr. 30, 2014, eighteen pages [with concise explanation of relevancy in English].

* cited by examiner

*Primary Examiner* — Boris Chervinsky
(74) *Attorney, Agent, or Firm* — Fenwick & West LLP

(57) ABSTRACT

A driver assembly with an efficient mechanism for transferring heat away from an integrated circuit (IC) chip via a heat transfer member and conductive pattern lines formed on a substrate. The IC chip is mounted on connectors and is placed above the substrate. The IC chip operatively communicates with the display panel via at least a subset of the conductive pattern lines and a subset of the connectors. A heat transfer member is formed on the substrate and is configured to transfer heat generated by the integrated circuit to a component having a lower temperature than the IC chip. A heat transfer element is placed between the IC chip and the heat transfer member to transfer the heat generated by the IC chip to the heat transfer member.

20 Claims, 4 Drawing Sheets

DRIVER PACKAGE

CROSS-REFERENCE TO RELATED APPLICATION

This application claims priority under 35 U.S.C. 119(a) to Korean Patent Application No. 10-2011-0100909, filed on Oct. 4, 2011, which is hereby incorporated by reference in its entirety.

BACKGROUND

1. Field of the Disclosure

This disclosure relates to transferring heat generated by an integrated circuit (IC) chip of a driver assembly for supplying operating signals to a display device to prevent overheating of the IC chip.

2. Description of the Related Art

Display devices are used for displaying information on a display panel for visual interaction with users. Various types of display technologies were developed and currently available for use in electronic devices. The display devices may incorporate various types of technology including, among others, liquid crystal display (LCD) technology, organic light emitting display (OLED) technology, electrophoretic display technology, field emission display (FED) technology, and plasma display technology. In general, display devices include a display panel and a driver assembly for providing signals to operate pixel elements in the display panel.

One conventional way of implementing the driver assembly is by using chip-on-film (COF) technology. The COF generally uses a film (e.g., flexible substrate) and a driver integrated circuit (IC) chip mounted on the film. Wiring patterns are formed on the film and bumps are placed between the driver IC and the film to connect the driver IC to the wiring patterns. The wiring patterns connect the IC chip to signal lines of a display panel.

As the size of the display panel increases, the operating frequency and the operating voltage of the driver IC chip also increases. The increased frequency and the operating voltage of the driver IC increases the heat generated within the driver IC. Such increase the internal heat generation can cause the driver IC to overheat, resulting in malfunctioning as well as damage to the driver IC chip. The heating of the driver IC chip can compromise the reliability of the display device.

SUMMARY

Embodiments relate to a driver assembly with an efficient mechanism for transferring heat away from an integrated circuit (IC) chip via a heat transfer member and conductive pattern lines formed on a substrate. The IC chip is mounted on connectors and is placed above the substrate. The IC chip operatively communicates with the display panel via at least a subset of the conductive pattern lines and a subset of the connectors. A heat transfer member is formed on the substrate and is configured to transfer heat generated by the integrated circuit to a component having a lower temperature than the IC chip. A heat transfer element is placed between the IC chip and the heat transfer member to transfer the heat generated by the IC chip to the heat transfer member.

In one or more embodiments, the driver assembly is a chip on film (COF) device.

In one or more embodiments, the driver assembly includes an electrically insulating layer partly covering the conductive pattern lines. The connectors are placed on the part of the conductive pattern lines not covered by the electrically insulating layer and extend between the conductive pattern lines and the IC chip.

In one or more embodiments, the drive assembly generates signals for transmission over scan lines or data lines of the display panel.

In one or more embodiments, the conductive pattern lines include one or more lines connecting the heat transfer member and the component to transfer heat from the heat transfer member to the component.

In one or more embodiments, the one or more lines further carry electric signals or reference voltage to or from the IC chip.

In one or more embodiments, the heat transfer element is formed on or attached to a bottom of the IC chip. The heat transfer element may have a flat configuration with an area smaller than the bottom surface of the IC chip.

In one or more embodiments, the heat transfer element is a filler material injected between the IC chip and the heat transfer member. The filler material is electrically non-conductive but thermally conductive. The filler material may cover an entire bottom surface of the IC chip.

In one or more embodiments, the heat transfer member and the plurality of conductive pattern lines are formed in the same fabrication process and are formed of the same material. The fabrication process may include depositing a layer of conductive film on the substrate and etching the deposited film.

DETAILED DESCRIPTION

Reference will now be made in detail to the present embodiments, examples of which are illustrated in the accompanying drawings.

Figure 1:
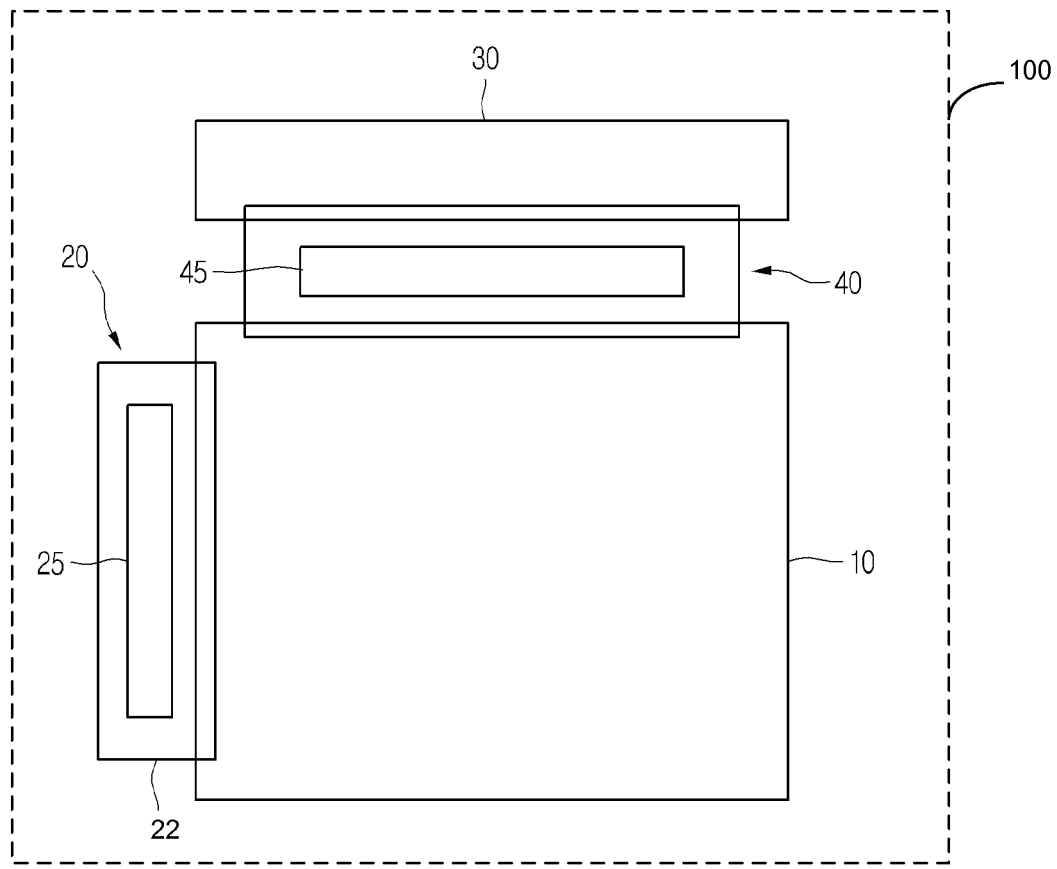
FIG. 1 is a plan view illustrating a display device according to one embodiment.

FIG. 1 is a plan view showing a display device 100 according to an embodiment. The display device 100 may be embodied using various technologies. For example, the display device 100 may be any one of a liquid crystal display (LCD) device, an organic light emitting display (OLED) device, an electrophoretic display device, a field emission display (FED) device and plasma display device.

The display device 100 according to the embodiment can include, among other components, a display panel 10, a first driver assembly 20, a second driver assembly 40 and a printed circuit board (PCB) 30. The display device 100 may include various other components such as a power source and communication interfaces, which are omitted herein for the sake of brevity.

The display panel 10 can include a plurality of pixel regions defined by a plurality of scan lines and a plurality of data lines crossing each other. The plurality of pixel regions can be arranged in a matrix, for example. The plurality of scan lines can be electrically connected to the first driver assembly 20. The plurality of data lines can be electrically connected to the second driver assembly 40. The pixel regions in a line can be selected by scan signals that are applied, for example, sequentially. By applying data signals to the data lines, one or more pixels in the selected pixel regions can be turned on or off.

The first driver assembly 20 generates the scan signals carried over a plurality of scan lines (not shown). For this purpose, the first driver assembly 20 can include, among other components, a first driver IC chip 25. The first driver IC chip 25 generates the scan signals for turning on or off pixels in the scan lines of the display panel 10.

The second driver assembly 40 generates the data signals for carrying over a plurality of data lines (not shown). For this purpose, the second driver assembly 40 can include, among other components, a second driver IC chip 45. The second driver IC chip 45 receives external signals from the PCB 30 and, in response, generates the data signals for turning on or off pixels in the data lines of the display panel 10.

As the size of the display panel 10 increases, the voltage level and/or the frequency of the scan signals and the data signals are increased. Such increase in the voltage level and/or frequency of the scan signals and the data signals accompanies increase in the internal heat generated by the first driver IC chip 25 and the second driver IC chip 45. Embodiments described herein enable effective removal of the internal heat generated in the first and second driver IC chips 25 and 45 outside of the display device 30 via PCB 30 or other components.

Although the following descriptions are described below primarily with reference to the first driver assembly 20, the embodiments described with reference to FIGS. 2 through 7 can be applied to the second driver IC assembly 40. That is, the second driver assembly 40 may have the same or similar structure as the first driver assembly 20 to remove the heat generated in the second driver IC chip 45.

Figure 2:
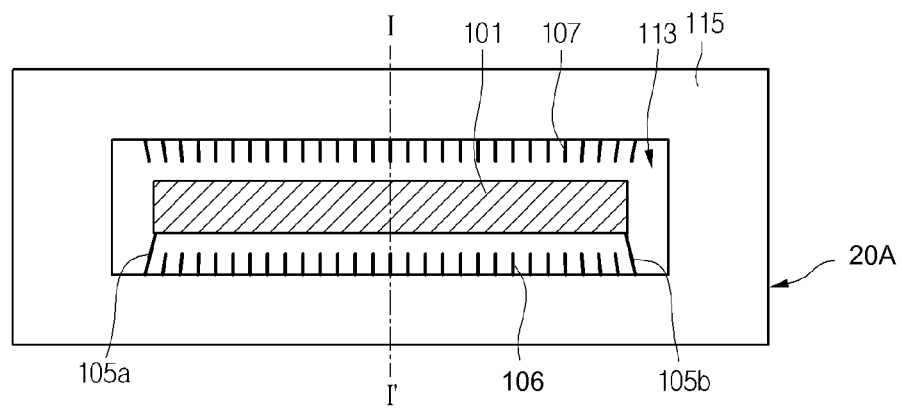
FIG. 2 is a plan view illustrating a first driver assembly in the display device of FIG. 1, according to a first embodiment.
Figure 3:
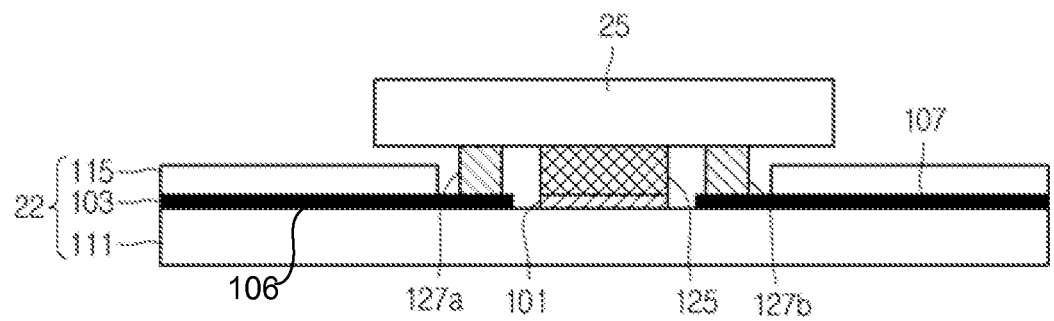
FIG. 3 is a cross-sectional view illustrating the first driver assembly of FIG. 2.

FIG. 2 is a plan view illustrating a first driver assembly 20A of the display device 100, according to a first embodiment. FIG. 3 is a cross-sectional view illustrating the first driver assembly 20A taken along line I-I' of FIG. 2. The first driver assembly 20A can include, among other components, a substrate member 22, the first driver IC chip 25, a first heat transfer member 101 and a second heat transfer member 125. The first IC chip 25 is mounted on the substrate member 22 to form a chip-on-film (COF) device. The first and second heat transfer members 101 transfers heat from the first IC chip 25 to the PCB 30.

The substrate member 22 can include, among others, a substrate 111, conductive pattern lines 103 on the substrate 111, and an insulation film 115 on the conductive pattern lines 103. The substrate 111 can be formed from a flexible material such as plastic or glass. Alternatively, the substrate 111 can be a thin layer of metal having a foil shape.

The conductive pattern lines 103 are formed of electrically conductive material. The conductive pattern lines 103 are sandwiched between the substrate 111 and the insulation film 115 except for a region corresponding to an opening 113 where the conductive pattern lines 103 are exposed for connection to the first driver IC 25 via bumps 127a, 127b. Such conductive pattern lines 103 can include, among other lines, a first signal line 106, a second signal line 107, a first ground line 105a and a second ground line 105b. The first signal line 106, the second signal line 108, the first ground line 105a and the second ground line 105b can be electrically connected to the PCB 30 to receive signals and power.

The conductive pattern lines 103 may include a single layer or multiple layers. One or more layers of the conductive pattern lines 103 may include materials such as gold, aluminum, silver, titanium, copper, nickel, platinum, molybdenum, tungsten, tantalum and chromium.

In one or more embodiments, the conductive pattern lines 103 are formed by depositing a conductive film on the substrate 111 and etching the conductive film, as well known in the art.

The first signal line 106, the first ground line 105a and the second ground lines 105a can be electrically connected to the PCB 30 through extra conductive pattern lines (not shown) formed on the display panel 10 and the second driver assembly 40.

The first signal line 106, the second signal line 107 and the ground lines 105a, 105b can be used to carry various signals. For example, the first signal line 106 can be used to transfer a scan control signal sent from the PCB 30 to the first driver IC chip 25. The first and second ground lines 105a and 105b can be connected to a reference voltage source (e.g., GND) and/or transfer heat generated in the first driver IC chip 25. The second signal line 107 can provide a signal path for sending a scan signal from the first driver IC chip 25 to a scan line on the display panel 10.

The insulation film 115 insulates the conductive pattern lines 103 from external environment to prevent external contaminants from short-circuiting the conductive pattern lines 103. An opening 113 can be formed in a central area of the substrate member 22 by removing the insulation film 115. The conductive pattern lines 103 (e.g., first and second signal lines 106, 107 and the first and second ground lines 105a and 105b) are exposed in the opening 113 to enable these lines to come in contact with the first driver IC 25 via bumps (e.g., bumps 127a, 127b). The first signal line 103, the first ground line 105a, second ground line 105b and the second signal line 107 are spatially separated in the opening 113 to prevent these lines from coming into contact with each other.

The first driver IC chip 25 can be mounted above the opening 113 of the substrate member 22. One side (e.g., the left side in FIG. 3) of the first driver IC chip 25 can be electrically connected to the first signal line 106, the first ground line 105a and the second ground line 105b. The other side (e.g., the right side in FIG. 3) of the first driver IC chip 25 can be electrically connected to the second signal line 107.

As illustrated in FIG. 3, a first heat transfer member 101 is formed on an area of substrate 111 exposed by the opening 113. The first heat transfer member 101 is surrounded by conductive pattern lines 103. The first heat transfer member 101 can be formed by the fabrication process for forming the first and second signal lines 106 and 107 and the first and second ground lines 105a and 105b. Consequently, the first heat transfer member 101 may be of the same material as and formed in the same layer as the first and second signal lines 106 and 107 and the first and second ground lines 105a and 105b. The fabrication process may include depositing a film on the substrate 111 and then etching the film.

The first heat transfer member 101 can be electrically insulated from the first and second signal lines 103 and 107. For this purpose, the first and second signal lines 106 and 107 can be spaced away from the first heat transfer member 101.

The first and second ground lines 105a and 105b can be electrically connected to the first heat transfer member 101. The first heat transfer member 101 can remove heat generated in the first driver assembly 20A via the first and second ground lines 105a,105b and the PCB 30.

The first heat transfer member 101 can be formed from a thermally conductive resin material such as epoxy or silicon. The first heat transfer member 101 can be prepared by forming a liquid resin material on the substrate member 22 within the opening 113 and curing the liquid resin material into a hard solid. Alternatively, the first heat transfer member 101 may be a tape formed from a resin material on the substrate member 22 exposed to the opening 113.

Figure 4:
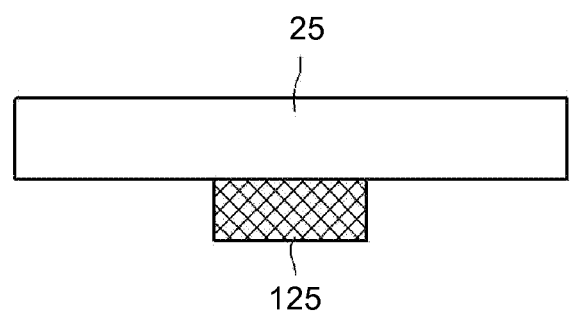
FIG. 4 is a cross-sectional view illustrating the driver integrated circuit (IC) chip attached with a second heat transfer member.

FIG. 4 is a cross-sectional view illustrating the first driver IC chip 25 attached with a second heat transfer member 125, according to one embodiment. The second heat transfer member 125 can be formed on or attached to the bottom surface of the first driver IC chip 25. The second heat transfer member 125 comes into contact with the first heat member 101 to transfer heat from the body of the first driver IC 25 to the first heat transfer member 101. The second heat transfer member 125 can be formed, for example, as a tape attached to a bottom surface of the first driver IC chip 25. The tape comes into surface contact with both the first heat transfer member 125 and the first driver IC chip 25 and can be made of resin materials such as epoxy or silicon. Heat generated in the first driver IC chip 25 is transferred to the first heat transfer member 101 on the substrate member 22 through the second heat transfer member 125, and then transferred from the first heat transfer member 101 to the printed circuit board 30 via the first and second ground lines 105a, 105b.

The embodiment of FIGS. 2 and 3 enable efficient removal of heat from the first driver IC chip 25 to the PCB 30 via a heat transfer path including the second heat transfer member 125, the first heat transfer member 101 and the first and second ground lines 105a and 105b.

Figure 5:
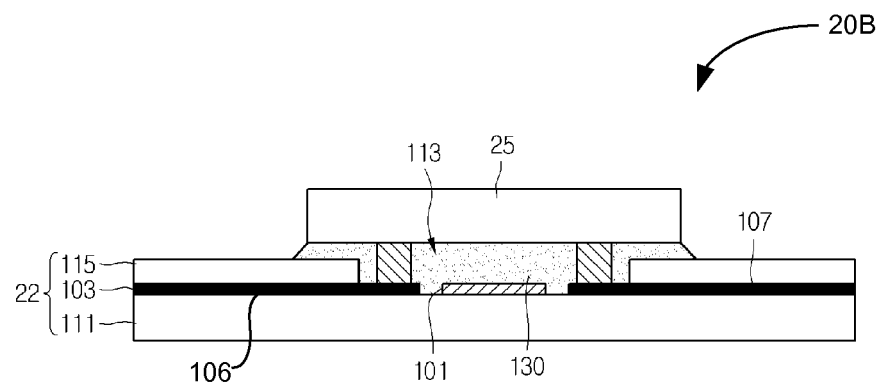
FIG. 5 is a cross-sectional view illustrating a first driver assembly according a second embodiment.

FIG. 5 is a cross-sectional view showing a first driver assembly 20B according a second embodiment. The first driver assembly 20B is substantially the same as the first driver assembly 20A of FIGS. 2 and 3 except that a heat transfer filler 130 is provided between the substrate member 22 and the first driver IC chip 25 instead of the second heat transfer member 125. Description of components in the second embodiment having the same function as those of the first embodiment will be omitted herein for the sake of brevity.

The first driver assembly 20B may include, among other components, a substrate member 22, a first driver IC chip 25, a heat transfer member 101 and a heat transfer filler 130. The heat transfer filler 130 can be formed between the substrate member 22 an the first driver IC chip 25 to cover the opening 113 of the substrate member and the circumference thereof. In other words, the heat transfer filler 130 can be formed not only on the first and second signal lines 103 and 107, the first and second ground lines 105a and 105b, the heat transfer member 101 and the substrate 111 exposed by the opening 113, but also on the inner edge area of the insulation film 115 adjacent to the opening 113.

The heat transfer filler 130 can be formed from a material that is electrically non-conductive but thermally conductive. The heat transfer filler 130 is electrically non-conductive, and hence, electrical short between the first driver IC chip 25 and the first and second signal lines 103 and 107 is prevented. The heat transfer filler 130 can be formed from materials such as an epoxy-based material or a silicon-based material.

After filling the thermally conductive filler 130 and forming the first and second bumps 127a, 127b on the substrate member 22, the first driver IC chip 25 is depressed to connect the first and second signal lines 103 and 107 on the substrate member 22 to the conductive pattern lines 103 using the first and second bumps 127a and 127b. Subsequently, the heat transfer filler 130 can be cured through a curing process using heat or laser beam.

In order to increase the amount of heat transferred, it is advantageous to have the heat transfer filler 130 come into contact with the first driver IC chip 25 as much as possible. The heat transfer filler 130 can be formed to make contact with the entire rear-surface of the first driver IC chip 25.

The second embodiment enables heat generated in the first driver IC chip 25 to be transferred to the heat transfer member via a heat transfer path including the heat transfer filler 130, the heat transfer member 101, the first ground line 105a and the second ground line 105b.

Figure 6:
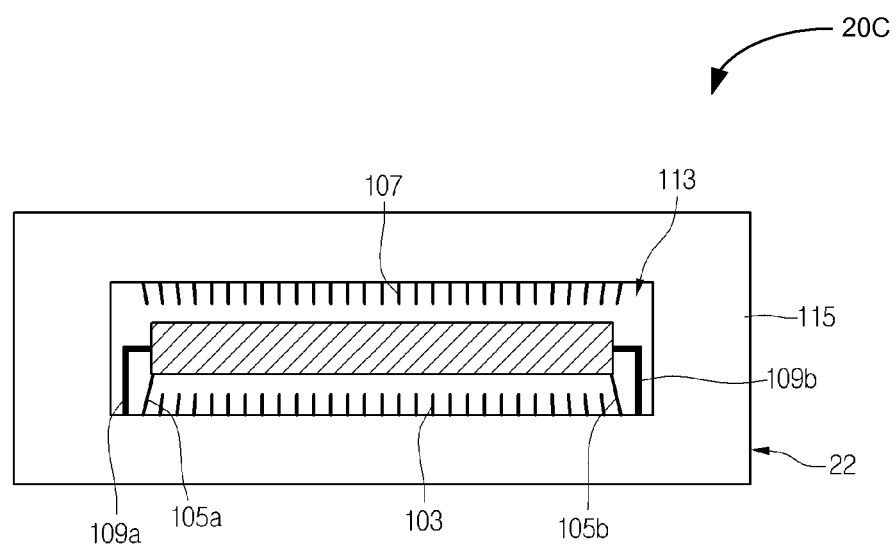
FIG. 6 is a plan view illustrating a first driver assembly according a third embodiment.

FIG. 6 is a plan view illustrating a first driver assembly 20C according a third embodiment. The first driver assembly 20C is substantially the same as the first driver assemblies 20A and 20B except that the first driver assembly 20C includes extra heat transfer lines 109a, 109b connected to the first heat transfer member 101 in addition to the first and second ground lines 105a, 105b of the first driver assembly 20A. Description of components in the first driver assembly 20C having the same function as those of the first driver assembly 20A will be omitted herein for the sake of brevity.

The conductive pattern lines 30 in the first driver assembly 20C include the first and second heat transfer lines 109a, 109b in addition to the first and second signal lines 106, 107 and the first and second ground lines 105a, 105b.

Unlike the first driver assembly 20A, the first and second ground lines 105a, 105b can be disconnected from the first heat transfer member 101 since the first and second heat transfer lines 109a, 109b form a heat path to transfer the heat from the first driver IC 25.

The first and second heat transfer lines 109a, 109b can be simultaneously formed using the same process for forming the first heat transfer member 101, the first and second signal lines 103 and 107, and the first and second ground lines 105a and 105b. Therefore, the first and second heat transfer lines 109a, 109b may be made in the same layer and made from the same material as the first and second signal lines 106 and 107, and the first and second ground lines 105a, 105b.

To increase the heat transfer, each of the first and second heat transfer lines 109a, 109b can have a width wider than the first and second signal lines 106, 107. If an extra margin remains in the substrate member 22, the first and second heat transfer lines 109a, 109b can be formed to have a wider width to increase the heat transfer.

Figure 7:
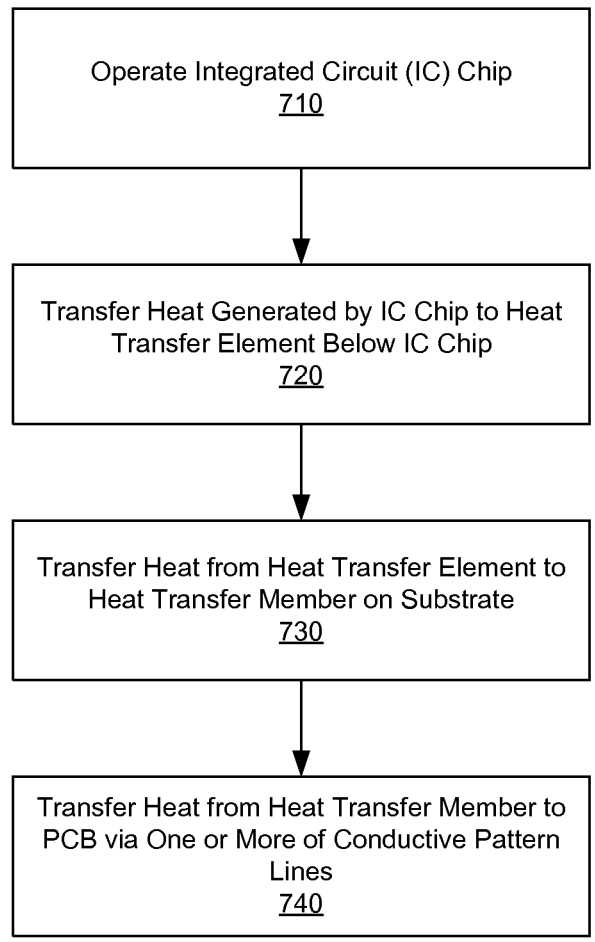
FIG. 7 is a flowchart illustrating a method for transferring heat from the driver IC chip to a printed circuit board, according to one embodiment.

FIG. 7 is a flowchart illustrating a method for transferring heat from the driver IC chip 25 to the PCB 30, according to one embodiment. The driver IC chip 25 is operated 710 to generate signals to the display panel 10. The generated signals may be scan signals transmitted over the scan lines of the display panel 10 or data signals transmitted over the data lines of the display panel 10. As a result of the operation, heat is generated by the driver IC chip 25.

The heat generated by the driver IC chip 25 is transferred 720 to a heat transfer element below the bottom surface of the driver IC chip 25. The heat transfer element may be the heat transfer member 125 (see FIGS. 3 and 4) or the heat transfer filler 130 (see FIG. 5).

The heat is then transferred 730 from the heat transfer element to the heat transfer member 101 formed on the substrate 111. The heat is then transferred 740 from the heat transfer member 101 to a component (e.g., PCB) with a lower temperature via one or more conductive pattern lines 103 formed on the substrate 111.

Embodiments allow heat generated in a driver IC chip of a COF to be effectively transferred to other components (e.g., the PCB 30) via a heat path including a heat transfer member. By reducing the temperature of the driver IC chip, malfunction and damage of the driver IC chip can be prevented.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a display panel including a plurality of pixel regions; and
   a driver assembly connected to the display panel and configured to generate signals for operating the display panel, the driver assembly comprising:
   a substrate;
   a plurality of conductive pattern lines formed on the substrate;
   an integrated circuit (IC) chip mounted on connectors and placed above the substrate, the IC chip operatively communicating with the display panel via at least a subset of the plurality of conductive pattern lines and at least a subset of the connectors;
   a heat transfer member formed on the substrate and configured to transfer heat generated by the IC chip to a component connected to the driver assembly; and
   a heat transfer element between the IC chip and the heat transfer member to transfer the heat generated by the IC chip to the heat transfer member.

2. The display device of claim 1, wherein the driver assembly is a chip on film (COF) device.

3. The display device of claim 1, wherein the driver assembly further comprises an electrically insulating layer partly covering the conductive pattern lines, wherein the connectors are placed on the conductive pattern lines not covered by the electrically insulating layer to extend between the conductive pattern lines and the IC chip.

4. The display device of claim 1, wherein the drive assembly generates signals for transmission over scan lines or data lines of the display panel.

5. The display device of claim 1, wherein the conductive pattern lines comprise one or more lines connecting the heat transfer member and the component to transfer heat from the heat transfer member to the component.

6. The display device of claim 5, wherein the one or more lines are connected to a reference voltage source.

7. The display device of claim 5, wherein the one or more lines have a first width wider than other conductive pattern lines for carrying signals between the IC chip and the display panel.

8. The display device of claim 5, wherein the one or more lines further carry electric signals or reference voltage to or from the IC chip.

9. The display device of claim 1, wherein the heat transfer element is formed on or attached to a bottom of the IC chip.

10. The display device of claim 1, wherein the heat transfer element comprises a filler material injected between the IC chip and the heat transfer member, wherein the filler material is electrically non-conductive but thermally conductive.

11. The display device of claim 9, wherein the filler material covers an entire bottom surface of the IC chip.

12. The display device of claim 1, wherein the heat transfer member and the plurality of conductive pattern lines are formed in a same fabrication process and are formed of a same material.

13. The display device of claim 12, wherein the fabrication process comprises depositing a layer of conductive film on the substrate and etching the deposited film.

14. The display device of claim 1, wherein the heat transfer member is formed by injecting and curing a thermally conductive resin material or by attaching a tape formed of a resin material on the substrate.

15. The display device of claim 1, further comprising another driver assembly configured to generate signals for operating the display panel.

16. A method for transferring heat from an integrated circuit (IC) chip in a display device, comprising:
   operating the IC chip to provide signals to a display panel of the display device;
   transferring heat generated by operation of the IC chip to a heat transfer element placed below the IC chip;
   transferring heat from the heat transfer element to a heat transfer member formed on a substrate; and
   transfer heat from the heat transfer member to a component via one or more conductive pattern lines formed on the substrate.

17. The method of claim 16, wherein the heat transfer element is a flat member attached to the IC chip or a filler material.

18. The method of claim 16, further comprising transmitting electric signals or reference voltage over the one or more conductive pattern lines.

19. The method of claim 16, wherein the heat transfer member and the one or more conductive pattern lines are formed in a same fabrication process and are formed of a same material.

20. A driver assembly for generating operation signals of a display panel, the driver assembly comprising:
   a substrate;
   a plurality of conductive pattern lines formed on the substrate;
   an integrated circuit (IC) chip mounted on connectors and placed above the substrate, the IC chip operatively communicating with the display panel via at least a subset of the plurality of conductive pattern lines and a subset of the plurality of conductive pattern lines;
   a heat transfer member formed on the substrate and configured to transfer heat generated by the IC chip to a component connected to the driver assembly; and
   a heat transfer element between the IC chip and the heat transfer member to transfer the heat generated by the IC chip to the heat transfer member.

* * * * *